United States Patent
Krause et al.

(10) Patent No.: US 8,374,808 B2
(45) Date of Patent: *Feb. 12, 2013

(54) DETECTION METHOD FOR MEMBRANE AND ELECTRODE FAILURES IN FUEL CELL STACKS

(75) Inventors: Bernd Krause, Liederbach (DE); Ralf Senner, Wiesbaden (DE); Balasubramanian Lakshmanan, Pittsford, NY (US); Andrew J. Maslyn, Rochester, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 500 days.

This patent is subject to a terminal disclaimer.

(21) Appl. No.: 12/690,672

(22) Filed: Jan. 20, 2010

(65) Prior Publication Data

US 2011/0178742 A1    Jul. 21, 2011

(51) Int. Cl.
    *G01R 31/36*      (2006.01)
(52) U.S. Cl. ......................................................... 702/63
(58) Field of Classification Search ................ 702/63
See application file for complete search history.

(56) References Cited

U.S. PATENT DOCUMENTS

| | | | | |
|---|---|---|---|---|
| 6,762,587 | B1* | 7/2004 | Barbetta | 320/116 |
| 2007/0111044 | A1* | 5/2007 | Chang | 429/9 |
| 2009/0325006 | A1* | 12/2009 | Yagi et al. | 429/13 |

* cited by examiner

*Primary Examiner* — Aditya Bhat
(74) *Attorney, Agent, or Firm* — John A. Miller; Miller IP Group, PLC

(57) ABSTRACT

A method for determining a failure of a membrane in a fuel cell in a fuel cell stack. The method includes measuring the voltage of each fuel cell in the fuel cell stack, calculating an average cell voltage from all of the cell voltages of the fuel cells in the fuel cell stack, and identifying a minimum cell voltage from all of the cell voltages of the fuel cells in the fuel cell stack. The method then determines an absolute delta voltage value as the difference between the average cell voltage of the fuel cells and the minimum cell voltage of the fuel cells at a plurality of sample points during the sample period. A plurality of absolute delta voltage values determined over a plurality of sample periods, filtered for low current density are used to determine whether there is a membrane failure and, by filtering for high current density, to determine whether there is an electrode failure.

20 Claims, 1 Drawing Sheet

DETECTION METHOD FOR MEMBRANE AND ELECTRODE FAILURES IN FUEL CELL STACKS

BACKGROUND OF THE INVENTION

1. Field of the Invention

This invention relates generally to a system and method for detecting failure of a membrane in a fuel cell in a fuel cell stack and, more particularly, to a system and method for detecting failure of a membrane in a fuel cell in a fuel cell stack that includes calculating an absolute delta voltage value that is an average of the difference between an average cell voltage and a minimum cell voltage at multiple sample points filtered for low stack current density.

2. Discussion of the Related Art

Hydrogen is a very attractive fuel because it is clean and can be used to efficiently produce electricity in a fuel cell. A hydrogen fuel cell is an electro-chemical device that includes an anode and a cathode with an electrolyte therebetween. The anode receives hydrogen gas and the cathode receives oxygen or air. The hydrogen gas is dissociated in the anode to generate free protons and electrons. The protons pass through the electrolyte to the cathode. The protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs can be made by other techniques, such as catalyst coated diffusion medium (CCDM) and physical vapor deposition (PVD) processes. MEAs are relatively expensive to manufacture and require certain conditions for effective operation.

Several fuel cells are typically combined in a fuel cell stack to generate the desired power. For example, a typical fuel cell stack for a vehicle may have two hundred or more stacked fuel cells. The fuel cell stack receives a cathode input reactant gas, typically a flow of air forced through the stack by a compressor. Not all of the oxygen is consumed by the stack and some of the air is output as a cathode exhaust gas that may include water as a stack by-product. The fuel cell stack also receives an anode hydrogen reactant gas that flows into the anode side of the stack. The stack also includes flow channels through which a cooling fluid flows.

The fuel cell stack includes a series of bipolar plates positioned between the several MEAs in the stack, where the bipolar plates and the MEAs are positioned between the two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

As a fuel cell stack ages, the performance of the individual cells in the stack degrade differently as a result of various factors. There are different causes of low performing cells, such as cell flooding, loss of catalyst, etc., some temporary and some permanent, some requiring maintenance, and some requiring stack or fuel cell replacement to exchange those low performing cells. Although the fuel cells are electrically coupled in series, the voltage of each cell when a load is coupled across the stack decreases differently where those cells that are low performing cells have lower voltages. Thus, it is necessary to monitor the cell voltages of the fuel cells in the stack to ensure that the voltages of the cells do not drop below a predetermined threshold voltage to prevent cell voltage polarity reversal, possibly causing permanent damage to the cell.

One type of fuel cell degradation is known as cell membrane failure, which causes cell voltage loss at low stack current densities. Membrane failure is typically the result of many factors. Ineffective separation of the fuel and the oxidant could lead to accelerated failure of the membranes and the MEAs. The membrane failure also manifests itself by higher voltage loss at low stack current densities. One of the reasons for the membrane to fail is mechanical stress that is induced by the dynamic operation and dynamic change in operating conditions, especially as a result of the constant change of temperature and humidity can cause the membrane to fail. Another reason that can cause the membrane to fail is the chemical stress that can occur in the operating fuel cell. Membrane failure could also be the result of other factors, such as mechanical or fatigue failures, shorting, etc.

Cell membrane failure will typically cause one or both of two factors. One of the factors includes reactant gas cross-over through the membrane in a fuel cell that occurs as a result of pin-holes and other openings in the membrane that causes a voltage loss of the fuel cell. Pin-holes occur over time in response to the electrical environment within the fuel cell as a result of its operation. Reactant gas cross-over can occur from cathode to anode or anode to cathode depending on the relative pressures and partial pressures therebetween, which have the same failure consequences. As the size of the pin-holes increases and the amount of gas that crosses through the membrane increases, cell failure will eventually occur. Further, at high loads where significant power is being drawn from the fuel cell stack, a low performing cell that occurs as a result of cross-over could result in a stack quick-stop.

The other result of cell membrane failure occurs as a result of cell shorting, where the cathode and anode electrodes become in direct electrical contact with each other as a result of some undesirable condition.

Other types of fuel cell degradations are generally referred to as electrode failures, which also cause cell voltage loss and typically occur over all stack current densities or at least at high stack current densities. Fuel cell electrode failures are typically the result of flow channel flooding and general cell degradation, catalyst activity loss, catalyst support corrosion, electrode porosity loss, etc. over time.

SUMMARY OF THE INVENTION

In accordance with the teachings of the present invention, a method for determining a failure of a membrane in a fuel cell in a fuel cell stack is disclosed. The method includes measuring the voltage of each fuel cell in the fuel cell stack, calculating an average cell voltage from all of the cell voltages of the fuel cells in the fuel cell stack, and identifying a minimum cell voltage from all of the cell voltages of the fuel cells in the fuel cell stack. The method then determines an absolute delta voltage value as the difference between the average cell voltage of the fuel cells and the minimum cell voltage of the fuel cells at a plurality of sample points during the sample period filtered for low stack current density. A plurality of absolute delta voltage values determined over a plurality of sample periods, filtered for low current densities, are used to determine whether there is a membrane failure and, by filtering for high current densities, to determine whether there is an electrode failure.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for identifying failure of a membrane in a fuel cell in a fuel cell stack by calculating an absolute delta voltage value as an average of the difference between an average cell voltage and a minimum cell voltage for a plurality of sample points at low stack current density is merely exemplary in nature, and is in no way intended to limit the invention or its applications or uses.

Figure 1:
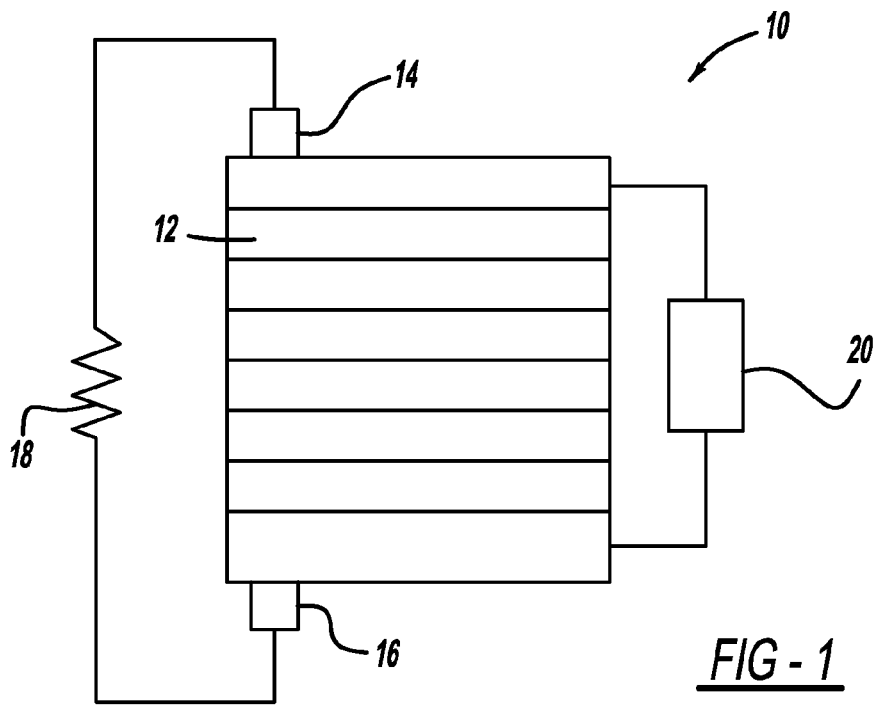
FIG. 1 is a simplified block diagram of a fuel cell stack.

FIG. 1 is a plan view of a fuel cell stack 10 including a plurality of fuel cells 12 electrically coupled in series. The fuel cell stack 10 also includes a positive terminal 14 and a negative terminal 16 that are electrically coupled to the fuel cells 12. A system load 18 is electrically coupled to the terminals 14 and 16. A voltage monitoring circuit 20 is electrically coupled to the fuel cells 12 that measures and monitors the voltage of each of the fuel cells 12. As will be discussed in detail below, the fuel cell monitoring circuit 20 measures the voltage of the fuel cells 12 and calculates absolute delta voltage values abs delta$U_{LCD}$ that are an average of the difference between an average cell voltage $U_{avg}$ and a minimum cell voltage $U_{min}$ at a plurality of consecutive sample points during a sample period.

According to the invention, the absolute delta voltage value abs delta$U_{LCD}$ is calculated as an average of the difference between the average cell voltage $U_{avg}$ and the minimum cell voltage $U_{min}$ at several sample points during a predetermined time period, for example, one hour. Thus, at each sample point, the average cell voltage $U_{avg}$ is calculated from all of the cell voltages, a minimum cell voltage $U_{min}$ is identified and the minimum cell voltage $U_{min}$ is subtracted from the average cell voltage $U_{avg}$. An average of all of the subtracted values provides the absolute delta voltage value abs delta$U_{LCD}$ over the sample period. This calculation can be expressed by the following equation.

$$\text{abs delta} U_{LCD} = \text{avg}(U_{avg} - U_{min})$$

As discussed above, membrane failure can only be determined using cell voltage at low stack current densities. Thus, the absolute delta voltage value abs delta$U_{LCD}$ is only calculated, and/or is only used, to determine membrane failure if the stack current density is below some predetermined value, such as 0.05 A/cm$^2$. The present invention proposes a technique for determining membrane failure, i.e., significant membrane pin holes or cell shorting, by calculating the absolute delta voltage value abs delta$U_{LCD}$ for each sample period when the stack current density is below some predetermined minimum value, which is analyzed over several sample periods over time.

Figure 2:
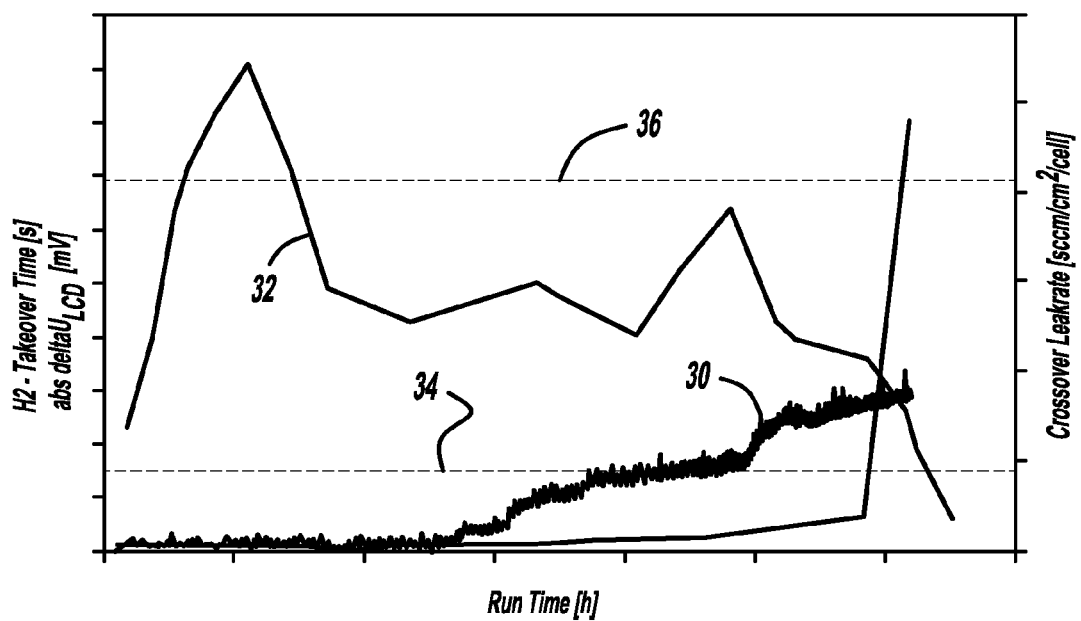
FIG. 2 is a graph with time on the horizontal, absolute delta voltage (average-minimum cell voltage) at low current density on the left vertical axis, hydrogen take-over time on the left vertical axis and cross-over leak rate on the right vertical axis.

FIG. 2 is a graph with run time on the horizontal axis, absolute delta voltage at low current density (LCD) for graph line 30 on the left vertical axis, hydrogen take-over time for graph line 32 on the left vertical axis and cross-over leak rate on the right vertical axis. The minimum cell LCD delta is a representation of the absolute delta voltage value abs delta$U_{LCD}$ that has been filtered for use only low stack current density. As is understood by those skilled in the art, hydrogen take-over is a known testing process where a fuel cell stack can be tested for membrane failure either due to cross-over leakage or an electrical shorting. In this test, the anode side of the stack is pressurized with hydrogen gas and the cathode side with air so that the anode pressure is higher than the cathode pressure. By monitoring the open circuit voltage of every single fuel cell in the fuel cell stack over time one can determine membrane failure due to cross-over or shorting. The slope of the open circuit voltage decrease over time is directly correlated to the cross-over leak rate.

Another known testing process to detect cross-over leakage is the physical cross-over test. In this test, only one side of the stack is pressurized with an inert gas (e.g. nitrogen) so that the leaking gas flow rate can be determined by measuring on the other side of the stack. This leakage rate represents how much gas is crossing through the membranes in the stack, typically through pin-holes. However, the hydrogen take-over test as well as the physical cross-over test require a fuel cell stack to be removed from the vehicle and placed on suitable test equipment, thus providing obvious drawbacks.

The graph in FIG. 2 shows that the absolute delta voltage value abs delta$U_{LCD}$ provides an accurate determination of the cross-over leakage through the membrane as compared to the hydrogen take-over test. Therefore, instead of performing the hydrogen take-over test periodically, the information received by the absolute delta voltage value calculations show when the absolute delta voltage value abs delta$U_{LCD}$ approaches the graph line 34, where hydrogen take-over test do not need to be performed prior to that occurrence.

The line 34 is a hydrogen take-over failure line where a hydrogen take-over failure of the take-over test would occur and line 36 is a cross-over failure line where cell tests indicate a membrane failure will occur as a result of reactant gas cross-over. These thresholds are empirically determined and reflect that fuel cell stacks crossing these thresholds need to be exchanged and repaired because of too high of a cross-over leakage. The graph line 30 shows the absolute delta voltage value abs delta$U_{LCD}$ sample points for each sample period when the stack current density is below the predetermined minimum value. As time passes, the absolute delta voltage value abs delta$U_{LCD}$ begins to increase at some point indicating that cross-over is beginning to occur. As is apparent, the graph line 30 approaches the hydrogen take-over failure criteria line 34, and thus can be used to indicate when a cell failure may occur for hydrogen take-over. Therefore, by plotting and analyzing the absolute delta voltage values abs delta$U_{LCD}$, it can be determined when membrane failure may become a problem. As the absolute delta voltage values abs deltaU$_{LCD}$ approach some predetermined threshold over consecutive sample periods, then one can determine when a stack failure may occur before it does occur.

By looking at the absolute delta voltage value abs deltaU$_{LCD}$ that is filtered to be below the minimum current density, such as 0.05 A/cm$^2$, it can be determined where there is a likely membrane failure as a result of cross-over leakage or cell shorting. The absolute delta voltage value abs deltaU$_{LCD}$ value that is not filtered for the low current density situation could be looked at for higher stack current densities to indicate other cell problems, such as cell voltage degradation or flow channel flooding. Thus, it is possible to use the absolute delta voltage value for a low current density band, i.e., below 0.05 A/cm$^2$, and a high current density band, such as greater than 0.6 A/cm$^2$, to differentiate between membrane failures and electrode failures. More specifically, if it is determined that the absolute delta voltage value abs deltaU$_{LCD}$ is greater than a threshold for the low current density filter and not above a threshold for the high stack current density filter, then it can be determined that the failure is a result of membrane failure for cross-over leakage or cell shorting. If, however, the absolute delta voltage value shows that the threshold has been exceeded for the both the high current density filter and the low current density filter, then it can be identified as an electrode failure.

In order to reduce the impact of the dynamic operation, which could also lead to a temporary high voltage difference, all the voltage differences are averaged over a reasonable period of time. As discussed, most of the information is available by filtering for two current density bands. This correlation holds true irrespective of the temporal operation condition changes of the stack.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for identifying a membrane failure in a fuel cell that is one of a plurality of fuel cells in a fuel cell stack, said method comprising:
   using a voltage monitoring circuit to perform the steps of:
   measuring the voltage of each fuel cell in the fuel cell stack;
   calculating an average cell voltage from the cell voltages of all of the fuel cells in the fuel cell stack at several sample points over a sample period;
   identifying a minimum cell voltage from all of the cell voltages of the fuel cells in the fuel cell stack at several sample points over the sample period;
   determining an absolute delta voltage value as an average of the difference between the average cell voltages of the fuel cells and the minimum cell voltage of the fuel cells for the sample period; and
   using the absolute delta voltage value to determine whether there is a membrane failure.

2. The method according to claim 1 further comprising determining the current density of the fuel cell stack and only using the absolute delta voltage value to determine if there is a membrane failure if the current density is below a predetermined minimum current density value.

3. The method according to claim 2 wherein the predetermined minimum current density value is 0.05 A/cm$^2$.

4. The method according to claim 2 wherein using the absolute delta voltage value to determine whether there is a membrane failure includes determining that the absolute delta voltage value is greater than a predetermined threshold when the current density of the fuel cell stack is below the predetermined minimum current density value.

5. The method according to claim 2 further comprising determining the absolute delta voltage value when the current density of the fuel cell stack is above a predetermined maximum current density value where the combination of the absolute delta voltage values for both the maximum current density and the minimum current density indicates a cell electrode failure.

6. The method according to claim 5 wherein the predetermined maximum current density value is 0.6 A/cm$^2$.

7. The method according to claim 1 further comprising monitoring the absolute delta voltage value over time to determine if the absolute delta voltage value is approaching a threshold value at consecutive sample periods indicating cell membrane failure.

8. The method according to claim 1 further comprising using the absolute delta voltage value to determine whether the fuel cell stack is approaching a hydrogen take-over failure.

9. A method for identifying a membrane failure in a fuel cell that is one of the plurality of fuel cells in the fuel cell stack, said method comprising:
   using a voltage monitoring circuit to perform the steps of:
   measuring the voltage of each fuel cell in the fuel cell stack;
   calculating an average cell voltage from the cell voltages of all of the fuel cells in the fuel cell stack at several sample points over a sample period;
   identifying a minimum cell voltage from all of the cell voltages of the fuel cells in the fuel cell stack at several sample points over the sample period;
   determining an absolute delta voltage value as an average of the difference between the average cell voltage of the fuel cells and the minimum cell voltage of the fuel cells for the sample period;
   determining that a current density of the fuel cell stack is below a predetermined minimum current density value; and
   monitoring the absolute delta voltage value at consecutive sampled periods over time when the stack current density is below the minimum current density value to determine if the absolute delta voltage value is approaching a threshold value indicating cell membrane failure.

10. The method according to claim 9 wherein the predetermined minimum current density value is 0.05 A/cm$^2$.

11. The method according to claim 9 further comprising determining the absolute delta voltage value when the current density of the fuel cell stack is above a predetermined maximum current density value where the combination of the absolute delta voltage values for both the maximum current density and the minimum current density indicates a cell electrode failure.

12. The method according to claim 11 wherein the predetermined maximum current density value is 0.6 A/cm$^2$.

13. The method according to claim 9 further comprising using the absolute delta voltage value to determine whether the fuel cell stack is approaching a hydrogen take-over failure.

14. A system for identifying a membrane failure in a fuel cell that is one of a plurality of fuel cells in the fuel cell stack, said system comprising:
   means for measuring the voltage of each fuel cell in the fuel cell stack;

means for calculating an average cell voltage from all of the cell voltages of the fuel cells in the fuel cell stack at several sample points over a sample period;

means for identifying a minimum cell voltage from all of the cell voltages of the fuel cells in the fuel cell stack at several sample points over the sample period;

means for determining an absolute delta voltage value as an average of the difference between the average cell voltage of the fuel cells and the minimum cell voltage of the fuel cells for the sample period; and means for using the absolute delta voltage value to determine whether there is a membrane failure.

15. The system according to claim 14 further comprising means for determining the current density of the fuel cell stack that only uses the absolute delta voltage value to determine if there is a membrane failure if the current density is below a predetermined minimum current density value.

16. The system according to claim 15 wherein the predetermined minimum current density value is 0.05 A/cm$^2$.

17. The system according to claim 15 wherein the means for using the absolute delta voltage value to determine whether there is a membrane failure determines that the absolute delta voltage value is greater than a predetermined threshold when the current density of the fuel cell stack is below the predetermined minimum current density value.

18. The system according to claim 15 further comprising means for determining the absolute delta voltage value when the current density of the fuel cell stack is above a predetermined maximum current density value where the combination of the absolute delta voltage values for both the maximum current density and the minimum current density indicates a cell electrode failure.

19. The system according to claim 18 wherein the predetermined maximum current density value is 0.6 A/cm$^2$.

20. The system according to claim 15 further comprising means for monitoring the absolute delta voltage value over time to determine if the absolute delta voltage value is approaching a threshold value at consecutive sample periods indicating cell membrane failure.

* * * * *